US012796339B2

(12) United States Patent
Wu et al.

(10) Patent No.: US 12,796,339 B2
(45) Date of Patent: Nov. 10, 2026

(54) VARIABLE RESISTANCE MEMORY DEVICE

(71) Applicant: SAMSUNG ELECTRONICS CO., LTD., Suwon-si (KR)

(72) Inventors: Zhe Wu, Seoul (KR); Taeguen Kim, Seoul (KR); Jeonghee Park, Hwaseong-si (KR); Taehyeong Kim, Seoul (KR); Minji Yu, Seoul (KR)

(73) Assignees: SAMSUNG ELECTRONICS CO., LTD.; KOREA UNIVERSITY RESEARCH AND BUSINESS FOUNDATION

( * ) Notice: Subject to any disclaimer, the term of this patent is extended or adjusted under 35 U.S.C. 154(b) by 606 days.

(21) Appl. No.: 18/071,740

(22) Filed: Nov. 30, 2022

(65) Prior Publication Data

US 2023/0180641 A1 Jun. 8, 2023

(30) Foreign Application Priority Data

Dec. 2, 2021 (KR) ........................ 10-2021-0171195

(51) Int. Cl.

| | |
|---|---|
| ***H10N 70/20*** | (2023.01) |
| ***G11C 13/00*** | (2006.01) |
| ***H10B 63/00*** | (2023.01) |
| ***H10N 70/00*** | (2023.01) |

(52) U.S. Cl.

CPC ....... *H10N 70/231* (2023.02); *G11C 13/0011* (2013.01); *H10B 63/82* (2023.02); *H10N 70/823* (2023.02); *G11C 13/0026* (2013.01); *G11C 13/0028* (2013.01)

(58) Field of Classification Search

CPC ............... H10N 70/231; H10N 70/823; G11C 13/0011; G11C 13/0026; G11C 13/0028; H10B 63/82

See application file for complete search history.

(56) References Cited

U.S. PATENT DOCUMENTS

| | | | |
|---|---|---|---|
| 7,227,221 | B2 | 6/2007 | Ovshinsky |
| 7,877,542 | B2 | 1/2011 | Chow et al. |
| 9,024,284 | B2 | 5/2015 | Oyanagi et al. |
| 9,893,280 | B2 | 2/2018 | Suzuki et al. |
| 9,978,936 | B2 | 5/2018 | Erbetta et al. |
| 10,460,801 | B2 | 10/2019 | Lille et al. |

(Continued)

FOREIGN PATENT DOCUMENTS

| | | | | |
|---|---|---|---|---|
| CN | 108987567 A | * 12/2018 | | ........... H10N 70/801 |
| KR | 10-2259289 B1 | 6/2021 | | |
| KR | 1020210124843 A | 10/2021 | | |

*Primary Examiner* — Britt Hanley
*Assistant Examiner* — Casey Paul Boatman
(74) *Attorney, Agent, or Firm* — Muir Patent Law, PLLC

(57) ABSTRACT

A variable resistance memory device includes a substrate, a first conductive line on the substrate, the first conductive line extending in a first horizontal direction, a second conductive line extending on the first conductive line in a second horizontal direction perpendicular to the first horizontal direction, and a memory cell at an intersection between the first conductive line and the second conductive line, the memory cell having a selection element layer, an intermediate electrode layer, and a variable resistance layer, and the variable resistance layer having a shape of stairs with a concave center.

20 Claims, 15 Drawing Sheets

(56) References Cited

U.S. PATENT DOCUMENTS

| | | | | |
|---|---|---|---|---|
| 2007/0284622 | A1* | 12/2007 | Ryoo | H10N 70/801 257/213 |
| 2012/0069645 | A1* | 3/2012 | Goux | H10N 70/8828 365/163 |
| 2020/0321398 | A1* | 10/2020 | Ko | H10N 70/063 |
| 2021/0167285 | A1 | 6/2021 | Horii et al. | |
| 2021/0313397 | A1* | 10/2021 | Lee | H10N 70/231 |

* cited by examiner

VARIABLE RESISTANCE MEMORY DEVICE

CROSS-REFERENCE TO RELATED APPLICATION

This application is based on and claims priority under 35 U.S.C. § 119 to Korean Patent Application No. 10-2021-0171195, filed on Dec. 2, 2021, in the Korean Intellectual Property Office, the disclosure of which is incorporated by reference herein in its entirety.

BACKGROUND

1. Field

Embodiments relate to a variable resistance memory device, and more particularly, to a variable resistance memory device having a cross point array structure.

2. Description of the Related Art

Recently, in accordance with a high speed and a low power of an electronic product, read/write operations of a semiconductor device mounted in such an electronic product have been required to have high speed and low operating voltage. In accordance with such requirements, research is being performed into a variable resistance memory device having an electronic structure that changes when voltage is applied in an amorphous state, so that electrical properties thereof alternate between non-conducting and conducting states, in accordance with voltage application. In particular, because a highly integrated variable resistance memory device may perform read/write operations at a high speed and is non-volatile, the highly integrated variable resistance memory device is rising as a next-generation memory device.

SUMMARY

According to an aspect of embodiments, there is provided a variable resistance memory device including a first conductive line extending on a substrate in a first horizontal direction, a second conductive line extending on the first conductive line in a second horizontal direction perpendicular to the first horizontal direction, and a memory cell formed at an intersection between the first conductive line and the second conductive line and having a selection element layer, an intermediate electrode layer, and a variable resistance layer. The variable resistance layer is in a form of a stair of which center is concave.

According to another aspect of embodiments, there is provided a variable resistance memory device including a first conductive line extending on a substrate in a first horizontal direction, a second conductive line extending on the first conductive line in a second horizontal direction perpendicular to the first horizontal direction, and a memory cell formed at an intersection between the first conductive line and the second conductive line and having a variable resistance layer in which a plurality of phase change material layers and a plurality of diffusion barrier layers are alternately stacked with each other. Areas respectively of the plurality of phase change material layers gradually reduce toward a center of each of the plurality of phase change material layers.

According to yet another aspect of embodiments, there is provided a variable resistance memory device including a plurality of first conductive lines extending on a substrate in a first horizontal direction, a plurality of second conductive lines extending on the plurality of first conductive lines in a second horizontal direction perpendicular to the first horizontal direction, a plurality of third conductive lines extending on the plurality of second conductive lines in the first horizontal direction, a plurality of first memory cells arranged at intersections between the plurality of first conductive lines and the plurality of second conductive lines, and a plurality of second memory cells arranged at intersections between the plurality of second conductive lines and the plurality of third conductive lines. Each of the plurality of first and second memory cells includes a selection element layer, an intermediate electrode layer, and a variable resistance layer that are stacked upward or downward. In the variable resistance layer in a form of a stair of which center is concave, a plurality of phase change material layers and a plurality of diffusion barrier layers are alternately stacked with each other.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
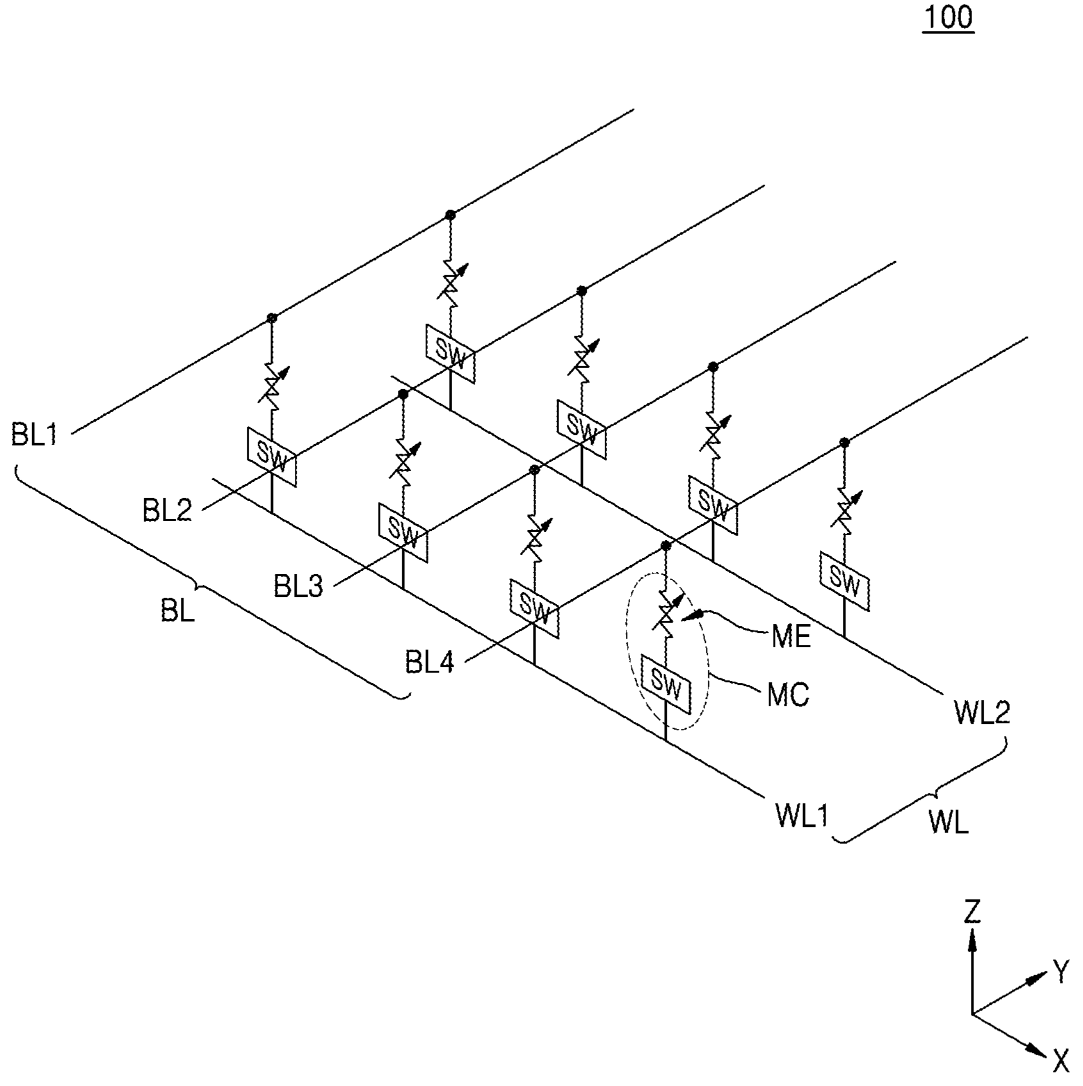
FIG. 1 is an equivalent circuit diagram illustrating a variable resistance memory device according to an embodiment.

FIG. 1 is an equivalent circuit diagram illustrating a variable resistance memory device 100 according to an embodiment.

Referring to FIG. 1, the variable resistance memory device 100 may include word lines WL, e.g., first and second word lines WL1 and WL2, extending in a first horizontal direction (an X direction) and spaced apart from each other in a second horizontal direction (a Y direction) perpendicular to the first horizontal direction (the X direction). In addition, the variable resistance memory device 100 may include bit lines BL, e.g., first through fourth bit lines BL1, BL2, BL3, and BL4, spaced apart from the word lines WL in a vertical direction (a Z direction) and extending in the second horizontal direction (the Y direction).

Each of memory cells MC may be arranged between each of the bit lines BL and each of the word lines WL. Specifically, each of the memory cells MC may be arranged at an intersection between each of the bit lines BL and each of the word lines WL and may include a variable resistance layer ME for storing information and a selection element layer SW for selecting each of the memory cells MC. The selection element layer SW may be referred to as a switching element layer or an access element layer.

The memory cells MC may be arranged to have the same structure in the vertical direction (the Z direction). For example, as illustrated in FIG. 1, in the memory cell MC arranged between the first word line WL1 and the first bit line BL1, the selection element layer SW may be electrically (e.g., and directly) connected to the first word line WL1, and the variable resistance layer ME may be electrically (e.g., and directly) connected to the first bit line BL1 and serially connected to the selection element layer SW. In another example, a position of the selection element layer SW may be exchanged with a position of the variable resistance layer ME, so the variable resistance layer ME may be, e.g., directly, connected to the word line WL1, and the selection element layer SW may be, e.g., directly, connected to the bit line BL1.

A method of driving the variable resistance memory device 100 will be simply described. A voltage is applied to the variable resistance layer ME of the memory cell MC through the word line WL and the bit line BL, so that a current may flow to the variable resistance layer ME. For example, the variable resistance layer ME may include a plurality of phase change material layers 147A (refer to FIG. 3), each of which may be reversibly transitioned, e.g., switched, between a first state and a second state. However, the variable resistance layer ME is not limited thereto and may include any variable resistor of which a resistance value varies in accordance with the applied voltage. For example, in the selected memory cell MC, resistance of the variable resistance layer ME may be reversibly transitioned between the first state and the second state in accordance with the voltage applied to the variable resistance layer ME.

In accordance with a change in resistance of the variable resistance layer ME, the memory cell MC may store digital information, e.g., '0' or '1', and may also erase the digital information from the memory cell MC. For example, data may be written in the memory cell MC in a high resistance state '0' and a low resistance state '1'. Here, the writing of the data from the high resistance state '0' to the low resistance state '1' may be referred to as 'a set operation' and the writing of the data from the low resistance state '1' to the high resistance state '0' may be referred to as 'a reset operation'.

However, the memory cell MC is not limited to the digital information in the high resistance state '0' and the low resistance state '1' and may store various resistance states in various forms (for example, 0, 1, 2, and 3). Although described later, the variable resistance memory device 100 according to an embodiment may implement a multilevel cell (MLC) using low power by using voltage distribution in a plurality of phase change material layers 147A (refer to FIG. 3) having different areas.

In addition, an arbitrary memory cell MC may be addressed by selecting the word line WL and the bit line BL, and the memory cell MC may be programmed by applying a predetermined signal between the word line WL and the bit line BL. In addition, information in accordance with a resistance value of the variable resistance layer ME of the corresponding memory cell MC, i.e., programmed information, may be read by measuring current value through the bit line BL.

Figure 2:
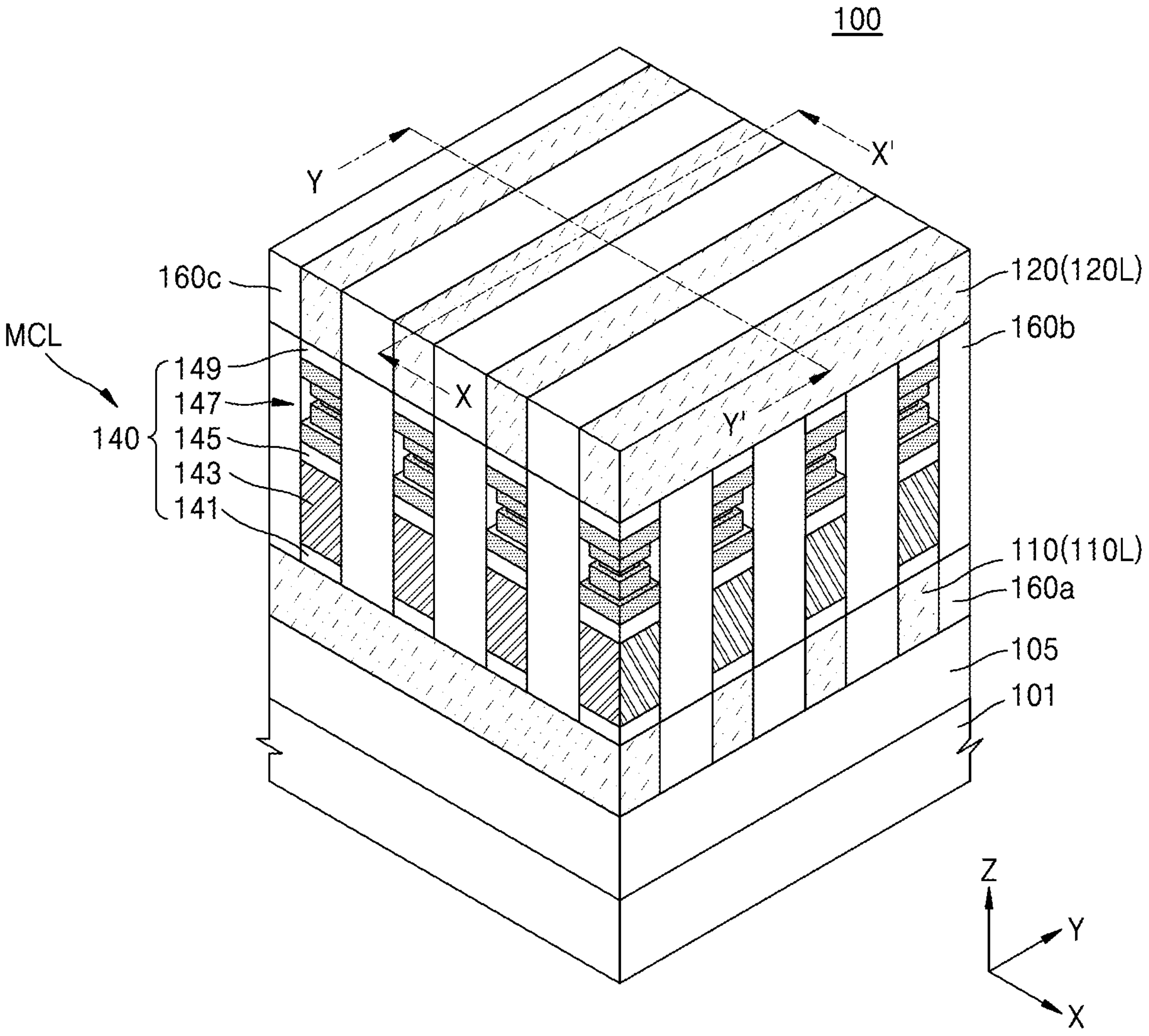
FIG. 2 is a perspective view illustrating a variable resistance memory device according to an embodiment.
Figure 3:
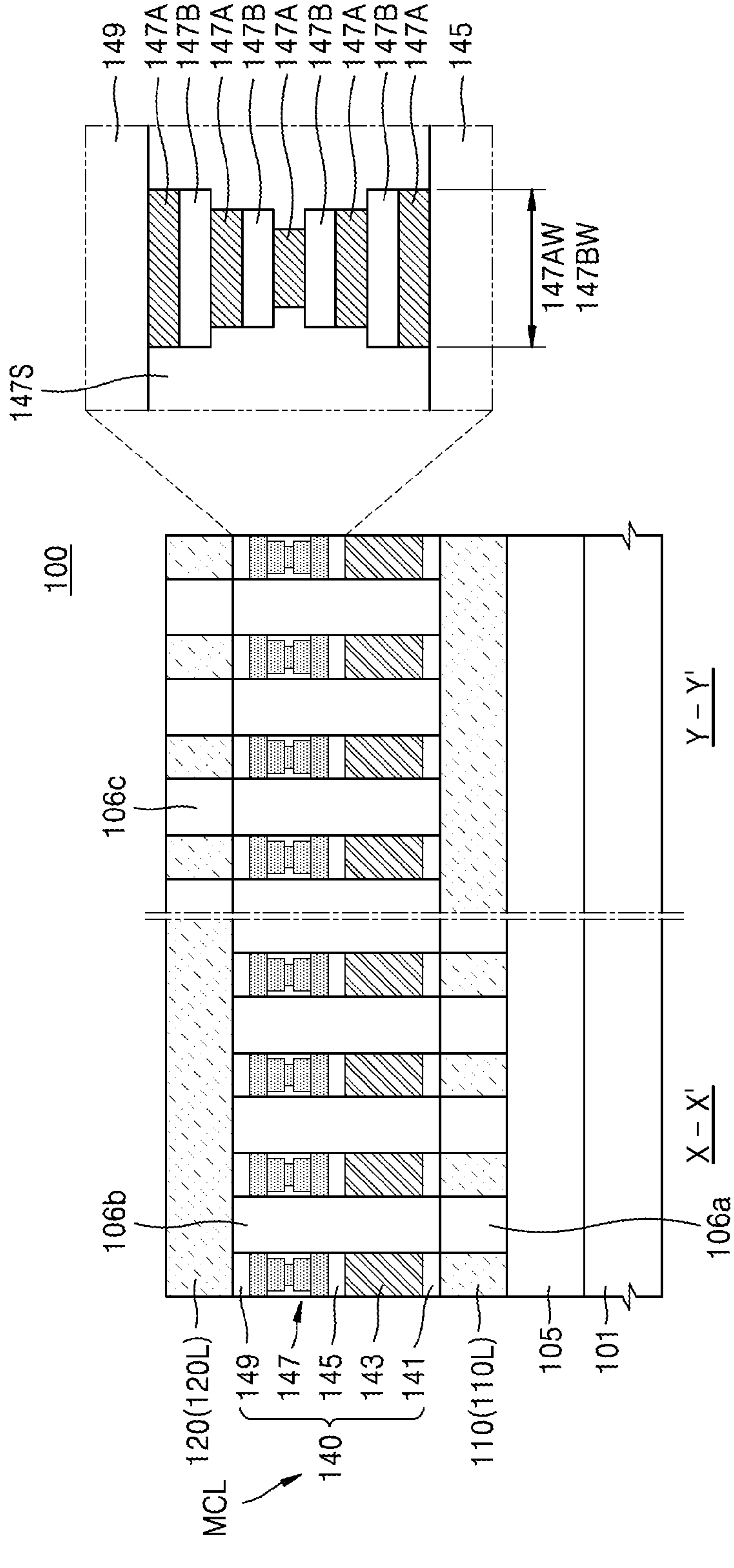
FIG. 3 is a cross-sectional view taken along lines X-X' and Y-Y' of FIG. 2.
Figure 4:
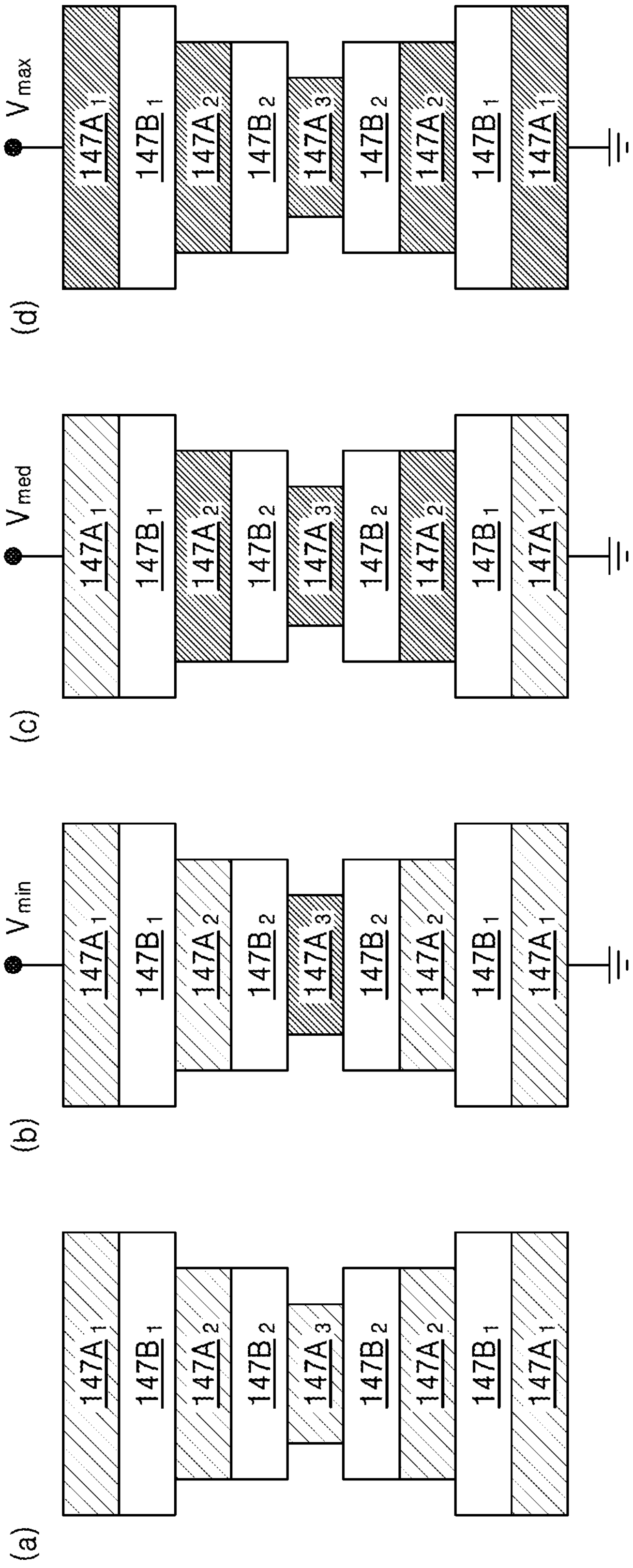
FIG. 4 is a diagram illustrating set and reset programming for a variable resistance layer of a variable resistance memory device according to an embodiment.

FIG. 2 is a perspective view illustrating a variable resistance memory device according to an embodiment, FIG. 3 is a cross-sectional view taken along lines X-X' and Y-Y' of FIG. 2, and FIG. 4 is a diagram illustrating set and reset programming for a variable resistance layer of a variable resistance memory device according to an embodiment.

Referring to FIGS. 2 to 4, the variable resistance memory device 100 may include a first conductive line layer 110L, a second conductive line layer 120L, and a memory cell layer MCL on a substrate 101. An interlayer insulating layer 105 may be arranged on the substrate 101. The interlayer insulating layer 105 may include, e.g., silicon oxide or silicon nitride, and may electrically isolate the first conductive line layer 110L from the substrate 101.

For example, in the variable resistance memory device 100 according to the current embodiment, an integrated circuit layer may be arranged on the substrate 101, and memory cells may be arranged on the integrated circuit layer. The integrated circuit layer may include a peripheral circuit for operations of the memory cells and/or a core circuit for operations. For reference, a structure in which the integrated circuit layer including the peripheral circuit and/or the core circuit is arranged on the substrate 101 and the memory cells are arranged on the integrated circuit layer is referred to as a cell on peri (COP) structure.

The first conductive line layer 110L may include a plurality of first conductive lines 110 extending in parallel in the first horizontal direction (the X direction). The second conductive line layer 120L may include a plurality of second conductive lines 120 extending in parallel in the second horizontal direction (the Y direction) intersecting with the first horizontal direction (the X direction). The first horizontal direction (the X direction) may vertically intersect with the second horizontal direction (the Y direction).

For example, in driving the variable resistance memory device 100, the plurality of first conductive lines 110 may respectively correspond to the word lines WL (refer to FIG. 1), and the plurality of second conductive lines 120 may respectively correspond to the bit lines BL (refer to FIG. 1). In another example, the plurality of first conductive lines 110 may respectively correspond to the bit lines BL (refer to FIG. 1), and the plurality of second conductive lines 120 may respectively correspond to the word lines WL (refer to FIG. 1).

Each of the plurality of first conductive lines 110 and the plurality of second conductive lines 120 may include, e.g., a metal, a conductive metal nitride, a conductive metal oxide, or a combination of the above metals. For example, each of the plurality of first conductive lines 110 and the plurality of second conductive lines 120 may include tungsten (W), tungsten nitride (WN), gold (Au), silver (Ag), copper (Cu), aluminum (Al), titanium aluminum nitride (TiAlN), iridium (Ir), platinum (Pt), palladium (Pd), ruthenium (Ru), zirconium (Zr), rhodium (Rh), nickel (Ni), cobalt (Co), chrome (Cr), tin (Sn), zinc (Zn), indium tin oxide (ITO), an alloy of the above metals, or a combination of the above metals. In addition, each of the plurality of first conductive lines 110 and the plurality of second conductive lines 120 may include a metal layer and a conductive barrier layer covering at least a part of the metal layer. The conductive barrier layer may include, e.g., titanium (Ti), titanium nitride (TiN), tantalum (Ta), tantalum nitride (TaN), or a combination of the above metals.

The memory cell layer MCL may include a plurality of memory cells 140 spaced apart from one another in the first horizontal direction (the X direction) and the second horizontal direction (the Y direction). As illustrated in FIG. 2, the plurality of first conductive lines 110 may intersect with the plurality of second conductive lines 120, and the plurality of memory cells 140 may be arranged at intersections between the plurality of first conductive lines 110 and the plurality of second conductive lines 120 between the first conductive line layer 110L and the second conductive line layer 120L.

For example, as illustrated in FIG. 2, the plurality of memory cells 140 may be square pillar-shaped, e.g., having a square cross-section in a top view. In another example, each of the plurality of memory cells 140 may be one of various pillar shapes, e.g., cylindrical, elliptical, or polygonal.

In addition, in accordance with a forming method, a lower portion of each of the plurality of memory cells 140 may be wider than an upper portion thereof or an upper portion of each of the plurality of memory cells 140 may be wider than a lower portion thereof. For example, when each of the plurality of memory cells 140 is formed by an embossed etching process, the lower portion thereof may be wider than the upper portion thereof. In addition, when each of the plurality of memory cells 140 is formed by a damascene process, the upper portion thereof may be wider than the lower portion thereof. In the embossed etching process or the damascene process, by precisely controlling etching to etch material layers so that sidewalls of each of the plurality of memory cells 140 are almost perpendicular, there may be almost no difference between a width of the upper portion of each of the plurality of memory cells 140 and a width of the lower portion thereof. In all the drawings hereinafter, including FIGS. 2 and 3, for convenience sake, the sidewalls of each of the plurality of memory cells 140 are illustrated as being almost perpendicular. However, the lower portion of each of the plurality of memory cells 140 may be wider than the upper portion thereof or the upper portion of each of the plurality of memory cells 140 may be wider than the lower portion thereof.

Each of the plurality of memory cells 140 may include a lower electrode layer 141, a selection element layer 143, an intermediate electrode layer 145, a variable resistance layer 147, and an upper electrode layer 149. When a positional relationship is not considered, the lower electrode layer 141, the intermediate electrode layer 145, and the upper electrode layer 149 may be respectively referred to as a first electrode layer, a second electrode layer, and a third electrode layer.

The variable resistance layer 147 may include a phase change material reversibly transitioning to an amorphous state or a crystalline state in accordance with a heating time. For example, the variable resistance layer 147 may include a material of which a phase may reversibly change by Joule heat occurring due to voltage applied to both ends thereof and of which resistance may change by such a phase change. In detail, the phase change material may be in a high resistance state in the amorphous state and may be in a low resistance state in the crystalline state. By defining the high resistance state as '0' and the low resistance state as '1', data may be stored in the variable resistance layer 147.

As illustrated in FIG. 3, in the variable resistance memory device 100 according to embodiments, the variable resistance layer 147 may be in the form of stairs of which the center is concave, e.g., lateral sidewalls of variable resistance layer 147 may have a stair profile that concaves at the center of the stair profile along the vertical direction. In addition, the variable resistance layer 147 may be formed by alternately stacking a plurality of phase change material layers 147A with a plurality of diffusion barrier layers 147B, e.g., a stack of alternating phase change material layers 147A and diffusion barrier layers 147B. In particular, the phase change material layers 147A may be respectively arranged as the uppermost layer and the lowermost layer of the variable resistance layer 147, e.g., so a number of the phase change material layers 147A may be larger than a number of the diffusion barrier layers 147B.

As seen from a side section, a width 147AW of each of the plurality of phase change material layers 147A and a width 147BW of each of the plurality of diffusion barrier layers 147B may gradually decrease toward the center thereof. For example, as illustrated in FIG. 3, maximal widths 147AW of corresponding ones of the phase change material layers 147A along the horizontal direction may be, e.g., directly, on the intermediate and upper electrodes 145 and 149, and may gradually decrease toward a center of the variable resistance layer 147, e.g., a center point between the intermediate and upper electrodes 145 and 149 along the vertical direction. For example, as illustrated in FIG. 3, the widths 147BW of the diffusion barrier layers 147B may equal the widths 147AB of corresponding ones of the phase change material layers 147A adjacent thereto, e.g., each of the diffusion barrier layers 147B may have an area equal to that of an area of an adjacent one of the phase change material layers 147A.

In some embodiments, a spacer 147S surrounding sidewalls of the variable resistance layer 147 may be provided. The spacer 147S may have an internal sidewall in the form of convex stairs to fill the concave stairs of the variable resistance layer 147, e.g., a surface of the spacer 147S facing the sidewall of the variable resistance layer 147 may have a shape complementary with respect to the sidewall of the variable resistance layer 147.

A voltage V applied from the upper electrode layer 149 and the intermediate electrode layer 145 to the variable resistance layer 147 may be respectively distributed to the plurality of phase change material layers 147A as first to third voltages $V_{A1}$, $V_{A2}$, and $V_{A3}$ in accordance with ratios of respective areas A of the plurality of phase change material layers 147A. Therefore, the first voltage $V_{A1}$ distributed to the phase change material layers 147A arranged in the uppermost layer and the lowermost layer of the plurality of phase change material layers 147A may be greater than the second voltage $V_{A2}$ and the third voltage $V_{A3}$ distributed to the phase change material layers 147A arranged in the remaining layers of the plurality of phase change material layers 147A. In accordance with a difference among the first to third voltages $V_{A1}$, $V_{A2}$, and $V_{A3}$, each of the plurality of memory cells 140 may operate as a multi-level cell. In particular, each of the plurality of memory cells 140 may operate as a 2-bit multi-level cell.

In the variable resistance layer 147, the plurality of phase change material layers 147A may include, e.g., at least one of $Sb_2Te_3$ and $Bi_2Te_3$, and the plurality of diffusion barrier layers 147B may include, e.g., at least one of $TiTe_2$, $NiTe_2$, $MoTe_2$, and $ZrTe_2$. However, the materials of the plurality of phase change material layers 147A and the plurality of diffusion barrier layers 147B are not limited thereto. That is, the variable resistance layer 147 of the variable resistance memory device 100 may include any suitable material having resistance change characteristics.

Each of elements of the variable resistance layer 147 may have one of various chemical composition ratios (stoichiometry). In accordance with the chemical composition ratio of each of the elements, a crystallization temperature, a melting point, a phase change rate in accordance with crystallization energy, and information retention of the variable resistance layer 147 may be controlled.

The variable resistance layer 147 may have a multilayer structure in which the plurality of phase change material layers 147A are stacked. The number of layers of the plurality of phase change material layers 147A and a thickness of each layer may be freely selected within embodiments. In addition, the plurality of diffusion barrier layers 147B may be formed among the plurality of phase change material layers 147A. The plurality of diffusion barrier layers 147B may prevent materials among the plurality of phase change material layers 147A from being diffused. That is, the plurality of diffusion barrier layers 147B may prevent preceding layers from diffusing when subsequent layers are formed among the plurality of phase change material layers 147A.

The selection element layer 143 may be a current control layer capable of controlling a current flow. The selection element layer 143 may include a material layer of which resistance may change in accordance with a magnitude of a voltage applied to both ends thereof.

The selection element layer 143 may include an Ovonic threshold switching (OTS) material. A function of the selection element layer 143 based on the OTS material will be simply described as follows. When a voltage less than a threshold voltage Vt is applied to the selection element layer 143, the selection element layer 143 maintains a high resistance state in which almost no current flows. When a voltage greater than the threshold voltage Vt is applied to the selection element layer 143, the selection element layer 143 is in a low resistance state so that a current starts to flow. In addition, when the current flowing through the selection element layer 143 is less than a holding current, the selection element layer 143 may be transitioned to the high resistance state.

The selection element layer 143 may include a chalcogenide switching material as the OTS material. In general, chalcogen elements are characterized by the presence of divalent bonding and a lone pair electron. In the divalent bonding, in order to form a chalcogenide material, the chalcogen elements are combined with one another to form chain and ring structures and the lone pair electron provides an electronic source for forming conductive filaments. For example, trivalent and tetravalent modifiers, e.g., aluminum (Al), gallium (Ga), indium (In), germanium (Ge), tin (Sn), silicon (Si), phosphorus (P), arsenic (As), and antimony (Sb), are included in the chain and ring structures of the chalcogen elements to determine the structural rigidity of the chalcogenide material and classify the chalcogenide material into a switching material and a phase change material in accordance with the ability to perform crystallization or another structural rearrangement.

The lower electrode layer 141, the intermediate electrode layer 145, and the upper electrode layer 149 functioning as a current path may include a conductive material. For example, each of the lower electrode layer 141, the intermediate electrode layer 145, and the upper electrode layer 149 may include a metal, conductive metal nitride, conductive metal oxide, or a combination of the above metals. For example, each of the lower electrode layer 141, the intermediate electrode layer 145, and the upper electrode layer 149 may include at least one of titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN). However, embodiments are not limited thereto.

The lower electrode layer 141 and the upper electrode layer 149 may be selectively formed. In other words, the lower electrode layer 141 and the upper electrode layer 149 may be omitted. However, in order to prevent the selection element layer 143 and the variable resistance layer 147 from directly contacting the first and second conductive lines 110 and 120, and to prevent contamination or contact failure from occurring, the lower electrode layer 141 and the upper electrode layer 149 may be arranged between the first and second conductive lines 110 and 120 and the selection element layer 143 and the variable resistance layer 147.

For example, a first insulating layer 160*a* may be arranged among the plurality of first conductive lines 110, and a second insulating layer 160*b* may be arranged among the plurality of memory cells 140 of the memory cell layer MCL. In addition, a third insulating layer 160*c* may be arranged among the plurality of second conductive lines 120. The first to third insulating layers 160*a* to 160*c* may include the same material or at least one of the first to third insulating layers 160*a* to 160*c* may include a different material. Each of the first to third insulating layers 160*a* to 160*c* may include, e.g., a dielectric material of silicon oxide or silicon nitride and may electrically isolate elements of each layer from one another.

In another example, an air gap may be formed instead of the second insulating layer 160*b*. When the air gap is formed, an insulating liner having a predetermined thickness may be formed between the air gap and each of the plurality of memory cells 140.

In the variable resistance memory device 100 according to embodiments, a method of implementing voltage distribution by using the plurality of phase change material layers 147A having different areas will be described in detail as follows.

The variable resistance layer 147 may have a confined heterostructure, e.g., a structure having different parts of different sizes that include different materials at an interface between the different parts. In the confined heterostructure, by controlling the areas of the plurality of phase change material layers 147A, the performance of the variable resistance memory device 100 may improve. In the confined heterostructure, an area in units of nanometers may be maintained by using an extreme ultraviolet (EUV) exposure process. In addition, because a variable for an area exists in each of the plurality of phase change material layers 147A in the confined heterostructure, in accordance with structure characteristics, a phase change section through an applied voltage $V_{bias}$ may vary.

In detail, referring to FIG. 4, a phase change occurs first in the phase change material layer 147A in the center of the phase change material layer 147A with the smallest area when the lowest voltage $V_{min}$ is applied (e.g., phase change material layer 147$A_3$ in part (b) of FIG. 4). As the applied voltage $V_{bias}$ increases, a size of a section in which a phase change occurs may increase in proportion to the applied voltage $V_{bias}$. Voltage distribution in accordance with a change in area of each of the plurality of phase change material layers 147A may be induced through a confined heterostructure capable of using a self-heating method in which a phase change may occur in a constant section. As a result, in the variable resistance memory device 100, characteristics of a multi-level cell in accordance with a magnitude of the applied voltage $V_{bias}$ may be induced.

In addition, according to embodiments, by inducing the voltage distribution in accordance with the change in area of each of the plurality of phase change material layers 147A, a relation for driving a multi-level cell minimizing a resistance drift may be represented. For example, an area change rate "a" may be obtained through a difference between an initial area $A_\alpha$ before a process change and a late area $A_\beta$ after the process change and capacitance C of each of the plurality of phase change material layers 147A in accordance with a change in area may be defined based on the area change rate "a". Therefore, when the voltage V is applied to the variable resistance memory device 100 having the self-heating method, an amount of the voltage applied to each of the plurality of phase change material layers 147A may be mathematically defined and inferred.

According to embodiments, by using the capacitance C of each of the plurality of phase change material layers 147A in accordance with the change in area, the multi-level cell may be implemented in accordance with a difference in phase change section in accordance with the voltage distribution. Here, the capacitance C is determined by the following [EQUATION 1] and affected by areas of each of the plurality of phase change material layers 147A and each of the plurality of diffusion barrier layers 147B.

$$C = \epsilon_0 \epsilon_r \frac{A}{d} \qquad \text{[EQUATION 1]}$$

In [EQUATION 1], C means capacitance, $\varepsilon_0$ means vacuum permittivity, $\varepsilon_r$ means a dielectric constant, A means an area, and d means a thickness. The remaining parameters other than the constant $\varepsilon_0$ may be controlled or changed in accordance with a kind of a material, a thickness of a material, and an area of a material. The capacitance C may be induced in accordance with the area A of each of the plurality of phase change material layers 147A through the [EQUATION 1] and may be inferred to as increasing up and down based on the phase change material layer 147A in the center of the phase change material layer 147A.

$$V_{A1} = V_{bias} \times \frac{2C_2 + C_3}{2(C_1 + C_2) + C_3} \qquad \text{[EQUATION 2]}$$

$$V_{A2} = V_{bias} \times \frac{2C_1 + C_3}{2(C_1 + C_2) + C_3} \qquad \text{[EQUATION 3]}$$

$$V_{A3} = V_{bias} \times \frac{2(C_1 + C_2)}{2(C_1 + C_2) + C_3} \qquad \text{[EQUATION 4]}$$

In [EQUATIONS 2-4], $C_1$ means capacitance of a phase change material layer 147$A_1$, $C_2$ means capacitance of a phase change material layer 147$A_2$, and $C_3$ means capacitance of a phase change material layer 147$A_3$. In addition, $V_{bias}$ means an entirely applied voltage, $V_{A1}$ means a voltage applied to the phase change material layer 147$A_1$, $V_{A2}$ means a voltage applied to the phase change material layer 147$A_2$, and $V_{A3}$ means a voltage applied to the phase change material layer 147$A_3$. That is, the voltage distribution in accordance with a difference among capacitances of the plurality of phase change material layers 147A may be defined.

$$\frac{|A_\alpha - A_\beta|}{A_\alpha} \times 100 = a(\%) \qquad \text{[EQUATION 5]}$$

$$\frac{|V_\alpha - V_\beta|}{V_\alpha} \times 100 = k(\%) \qquad \text{[EQUATION 6]}$$

In [EQUATIONS 5-6], $A_\alpha$ means an initial area of each of the plurality of phase change material layers 147A, $A_\beta$ means a later area of each of the plurality of phase change material layers 147A, "a" means the area change rate of each of the plurality of phase change material layers 147A, $V_\alpha$ means a voltage applied to the initial area of each of the plurality of phase change material layers 147A, $V_\beta$ means a voltage applied to the later area of each of the plurality of phase change material layers 147A, and k means a voltage change rate of each of the plurality of phase change material layers 147A.

In accordance with [EQUATION 1], the area A of each of the plurality of phase change material layers 147A is proportional to the capacitance C of each of the plurality of phase change material layers 147A. In accordance with [EQUATION 5], the capacitance C of each of the plurality of phase change material layers 147A may be defined by the area change rate "a".

By using the above equations, as schematically illustrated in part (a) of FIG. 4, a change in phase change section of each of the plurality of phase change material layers 147A in accordance with a change in applied voltage may be obtained. That is, part (a) of FIG. 4 illustrates a confined heterostructure in an initial state before a pulse voltage is applied, part (b) of FIG. 4 illustrates the phase change material layer 147$A_3$ in which a phase change starts to occur when the lowest voltage $V_{min}$ is applied, part (c) of FIG. 4 illustrates that the number of phase change material layers 147$A_2$ and 147$A_3$, in which a phase change occurs, increases when an intermediate voltage $V_{med}$ is applied, and part (d) of FIG. 4 illustrates that a phase change occurs in all sections of the phase change material layers 147$A_1$, 147$A_2$, 147$A_3$ when the highest voltage $V_{max}$ is applied.

As a result, in the variable resistance memory device 100 according to embodiments, in the stacked structure of the plurality of phase change material layers 147A having different areas, by the self-heating method of the confined heterostructure, due to the difference in voltage V in accordance with the capacitance C, a phase change section gradually increases from the center of each of the plurality of phase change material layers 147A. In the variable resistance memory device 100, the phase change section varies in accordance with the voltage distribution so that a multi-level cell may be implemented. In addition, in the variable resistance memory device 100, because a ratio of the voltage V applied to each of the plurality of phase change material layers 147A may be mathematically inferred, an operating voltage may be reduced.

Figure 5:
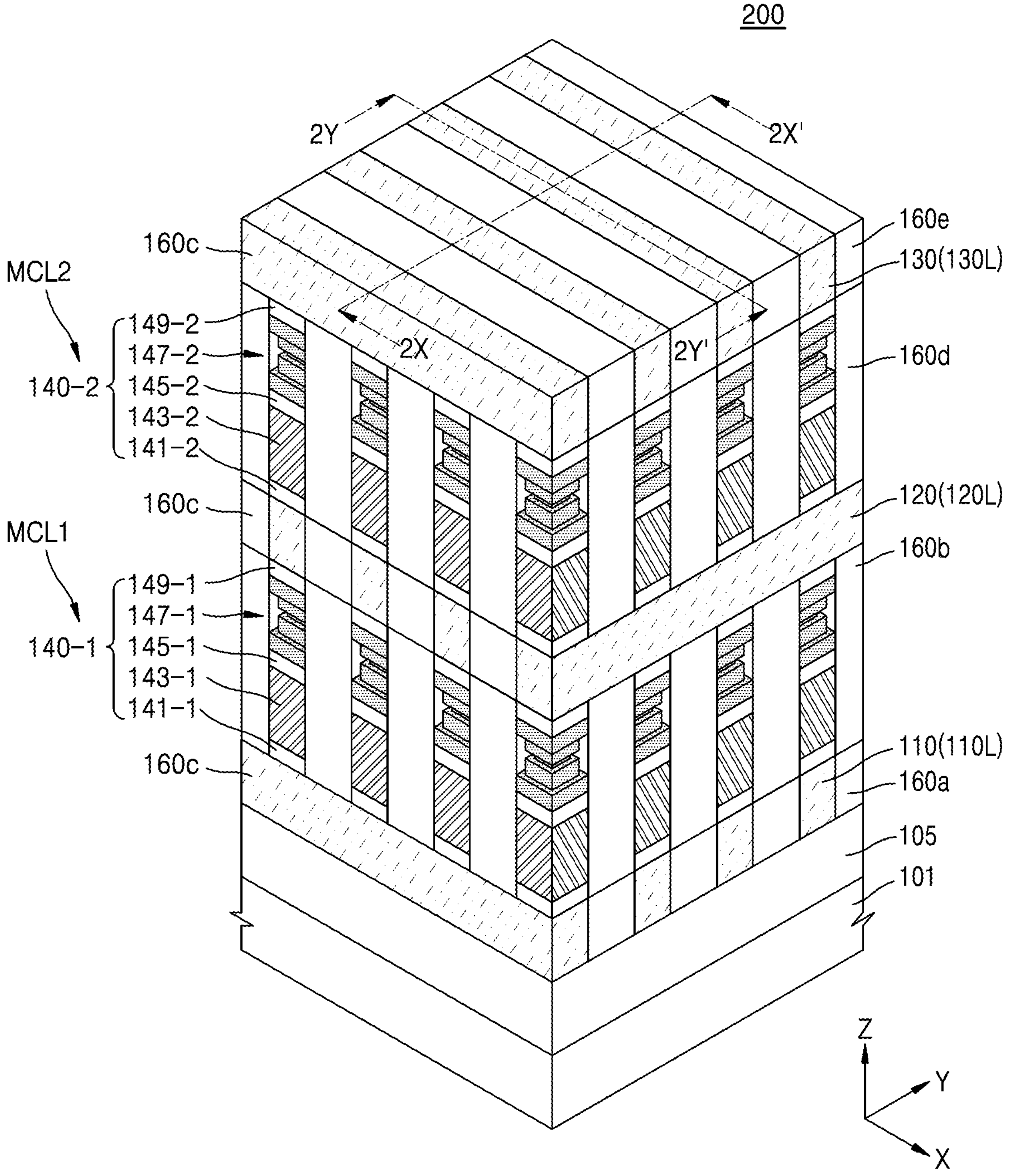
FIG. 5 is a perspective view illustrating a variable resistance memory device according to an embodiment.
Figure 6:
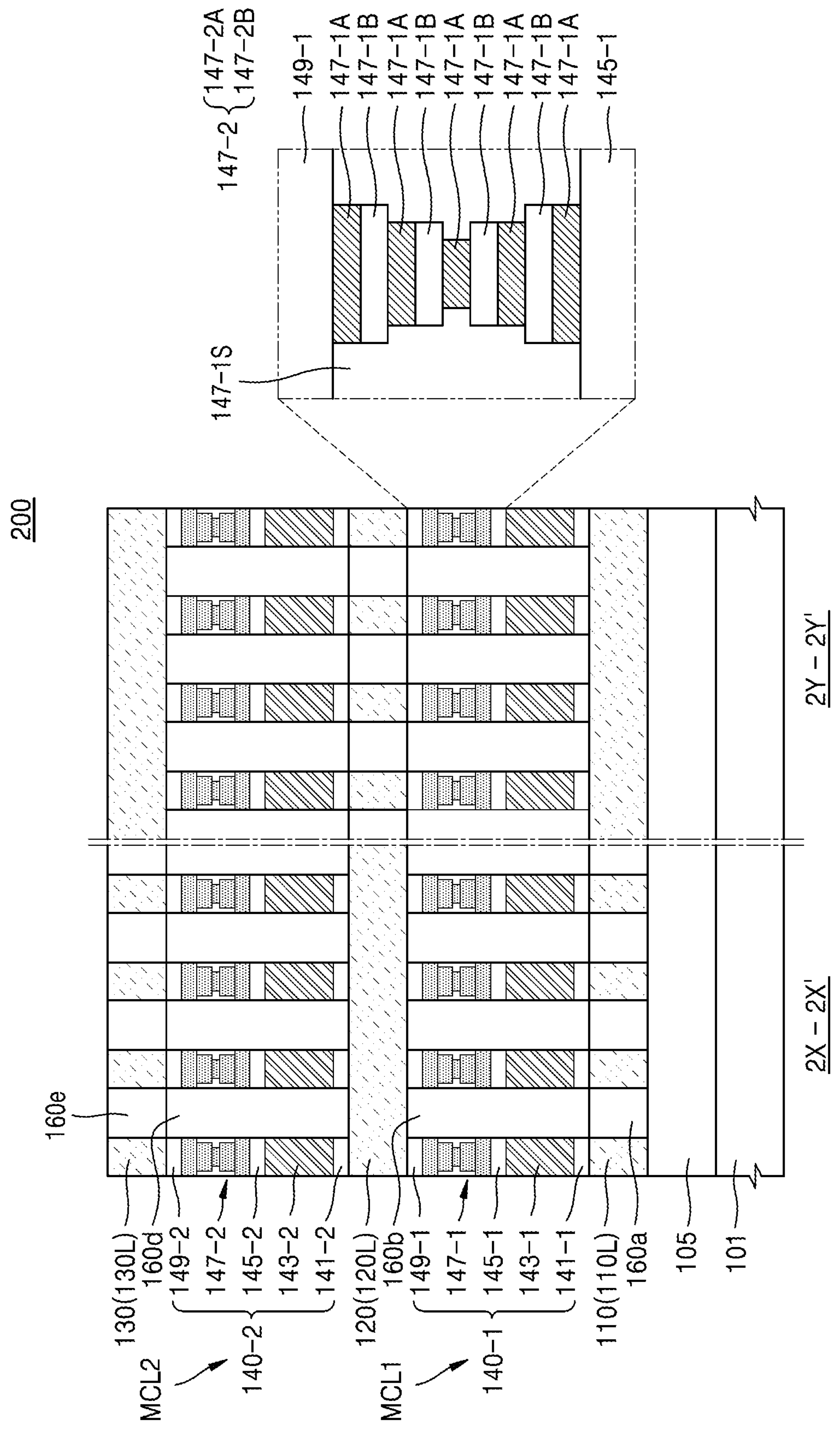
FIG. 6 is a cross-sectional view taken along lines 2X-2X' and 2Y-2Y' of FIG. 5.

FIG. 5 is a perspective view illustrating a variable resistance memory device 200 according to an embodiment, and FIG. 6 is a cross-sectional view taken along lines 2X-2X' and 2Y-2Y' of FIG. 5.

Most components of the variable resistance memory device 200 and materials of the components, which are described hereinafter, are substantially the same as or similar to most components of the variable resistance memory device 100 and materials of the components thereof, which are described with reference to FIGS. 1 to 4. Therefore, for convenience sake, a difference between the variable resistance memory device 100 described above and the variable resistance memory device 200 will be mainly described.

Referring to FIGS. 5 and 6, the variable resistance memory device 200 may include the first conductive line layer 110L, the second conductive line layer 120L, a third conductive line layer 130L, a first memory cell layer MCL1, and a second memory cell layer MCL2 on the substrate 101. As illustrated in FIGS. 5 and 6, the interlayer insulating layer 105 may be arranged on the substrate 101.

The first conductive line layer 110L may include the plurality of first conductive lines 110 extending in parallel in the first horizontal direction (the X direction). The second conductive line layer 120L may include the plurality of second conductive lines 120 extending in parallel in the second horizontal direction (the Y direction) intersecting with the first horizontal direction (the X direction). In addition, the third conductive line layer 130L may include a plurality of third conductive lines 130 extending in parallel in the first horizontal direction (the X direction). For example, the only difference between each of the plurality of first conductive lines 110 and each of the plurality of third conductive lines 130 may be in a position in the vertical direction (the Z direction) and each of the plurality of third conductive lines 130 may be substantially the same as each of the plurality of first conductive lines 110 in an extension direction or an arrangement structure.

For example, in driving the variable resistance memory device 200, the plurality of first conductive lines 110 and the plurality of third conductive lines 130 may respectively correspond to the word lines WL (refer to FIG. 1), and the plurality of second conductive lines 120 may respectively correspond to the bit lines BL (refer to FIG. 1). In another example, the plurality of first conductive lines 110 and the plurality of third conductive lines 130 may respectively correspond to the bit lines BL (refer to FIG. 1), and the plurality of second conductive lines 120 may respectively correspond to the word lines WL (refer to FIG. 1). When the plurality of first conductive lines 110 and the plurality of third conductive lines 130 correspond to the word lines WL (refer to FIG. 1), the plurality of first conductive lines 110 may respectively correspond to lower word lines, the plurality of third conductive lines 130 may respectively correspond to upper word lines, and the plurality of second conductive lines 120 may respectively correspond to common bit lines because the plurality of second conductive lines 120 are shared by the lower word lines and the upper word lines.

Each of the plurality of first conductive lines 110, the plurality of second conductive lines 120, and the plurality of third conductive lines 130 may include, e.g., a metal, a conductive metal nitride, a conductive metal oxide, or a combination of the above metals. In addition, each of the plurality of first conductive lines 110, the plurality of second conductive lines 120, and the plurality of third conductive lines 130 may include a metal layer and a conductive barrier layer covering at least a part of the metal layer.

The first memory cell layer MCL1 may include a plurality of first memory cells 140-1 spaced apart from one another in the first horizontal direction (the X direction) and the second horizontal direction (the Y direction). The second memory cell layer MCL2 may include a plurality of second memory cells 140-2 spaced apart from one another in the first horizontal direction (the X direction) and the second horizontal direction (the Y direction). As illustrated in FIGS. 5 and 6, the plurality of first conductive lines 110 may intersect with the plurality of second conductive lines 120, and the plurality of second conductive lines 120 may intersect with the plurality of third conductive lines 130. The plurality of first memory cells 140-1 may be arranged at intersections between the plurality of first conductive lines 110 and the plurality of second conductive lines 120 between the first conductive line layer 110L and the second conductive line layer 120L. The plurality of second memory cells 140-2 may be arranged at intersections between the plurality of second conductive lines 120 and the plurality of third conductive lines 130 between the second conductive line layer 120L and the third conductive line layer 130L.

Each of the plurality of first memory cells 140-1 and the plurality of second memory cells 140-2 may include lower electrode layers 141-1 and 141-2, selection element layers 143-1 and 143-2, intermediate electrode layers 145-1 and 145-2, variable resistance layers 147-1 and 147-2, and upper electrode layers 149-1 and 149-2. A structure of each of the plurality of first memory cells 140-1 may be substantially the same as that of each of the plurality of second memory cells 140-2.

For example, the first insulating layer 160*a* may be arranged among the plurality of first conductive lines 110, and the second insulating layer 160*b* may be arranged among the plurality of first memory cells 140-1 of the first memory cell layer MCL1. In addition, the third insulating layer 160*c* may be arranged among the plurality of second conductive lines 120, a fourth insulating layer 160*d* may be arranged among the plurality of second memory cells 140-2 of the second memory cell layer MCL2, and a fifth insulating layer 160*e* may be arranged among the plurality of third conductive lines 130. The first to fifth insulating layers 160*a* to 160*e* may include the same material or at least one of the first to fifth insulating layers 160*a* to 160*e* may include a different material. Each of the first to fifth insulating layers 160*a* to 160*e* may include, e.g., a dielectric material of oxide or nitride and may electrically isolate elements of each layer from one another.

In another example, an air gap may be formed instead of at least one of the second insulating layer 160*b* and the fourth insulating layer 160*d*. When the air gap is formed, an insulating liner having a predetermined thickness may be formed between the air gap and each of the plurality of first memory cells 140-1 and/or between the air gap and each of the plurality of second memory cells 140-2.

In the variable resistance memory device 200 according to the current embodiment, in a stacked structure of phase change material layers 147-1A and 147-2A having different areas, by a self-heating method of a confined heterostructure, due to a difference in voltage V in accordance with capacitance C, a phase change section gradually increases from the center of the stacked structure. In the variable resistance memory device 200, the phase change section varies in accordance with the voltage distribution so that a multi-level cell may be implemented. In addition, in the variable resistance memory device 200, because a ratio of the voltage V applied to each of the phase change material layers 147-1A and 147-2A may be mathematically inferred, an operating voltage may be reduced.

The variable resistance memory device 200 according to the current embodiment may have a structure in which the variable resistance memory device 100 described with reference to FIGS. 2 and 3 is repeatedly stacked. However, the structure of the variable resistance memory device 200 according to the current embodiment is not limited thereto.

Figure 7:
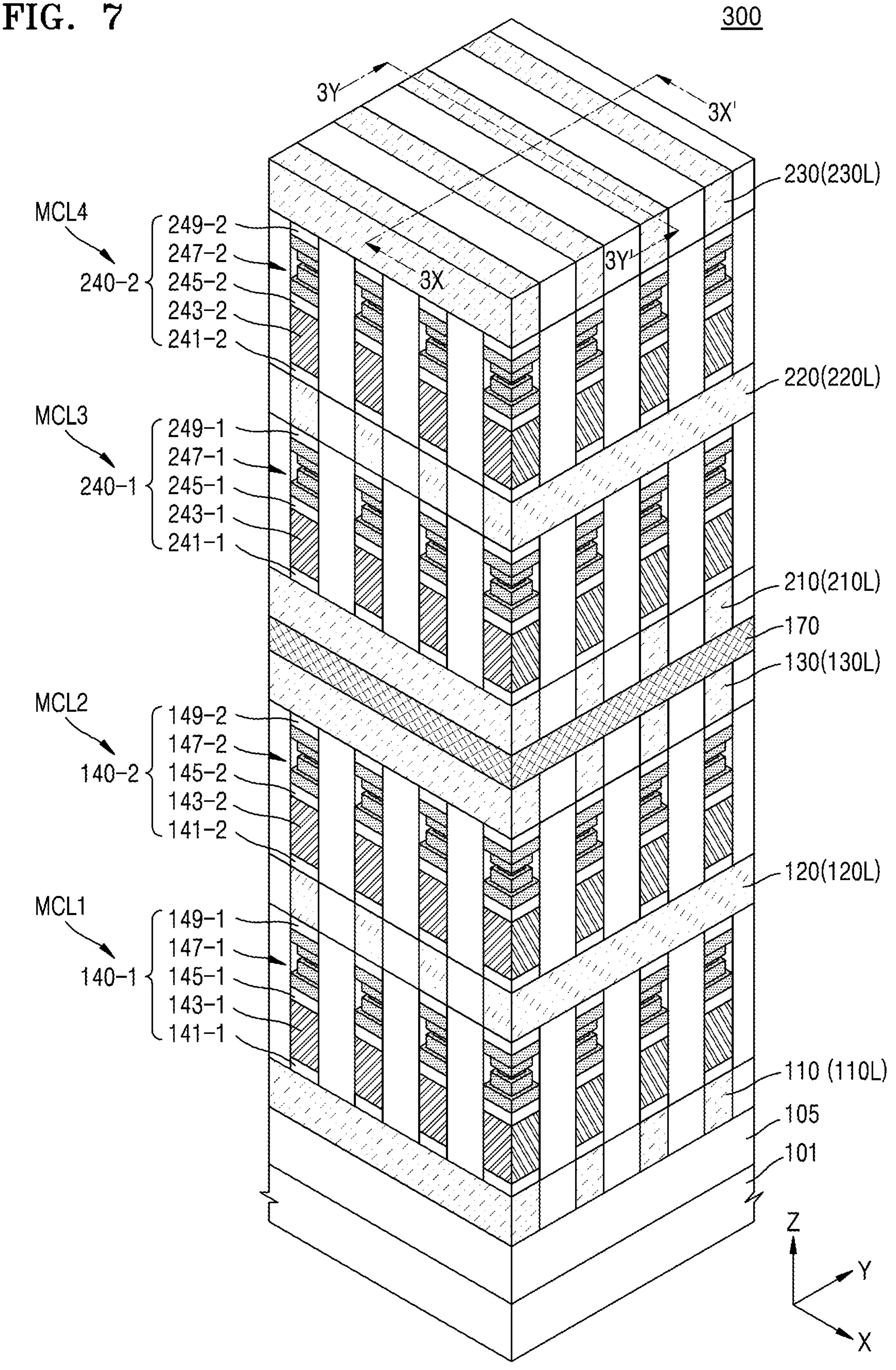
FIG. 7 is a perspective view illustrating a variable resistance memory device according to an embodiment.
Figure 8:
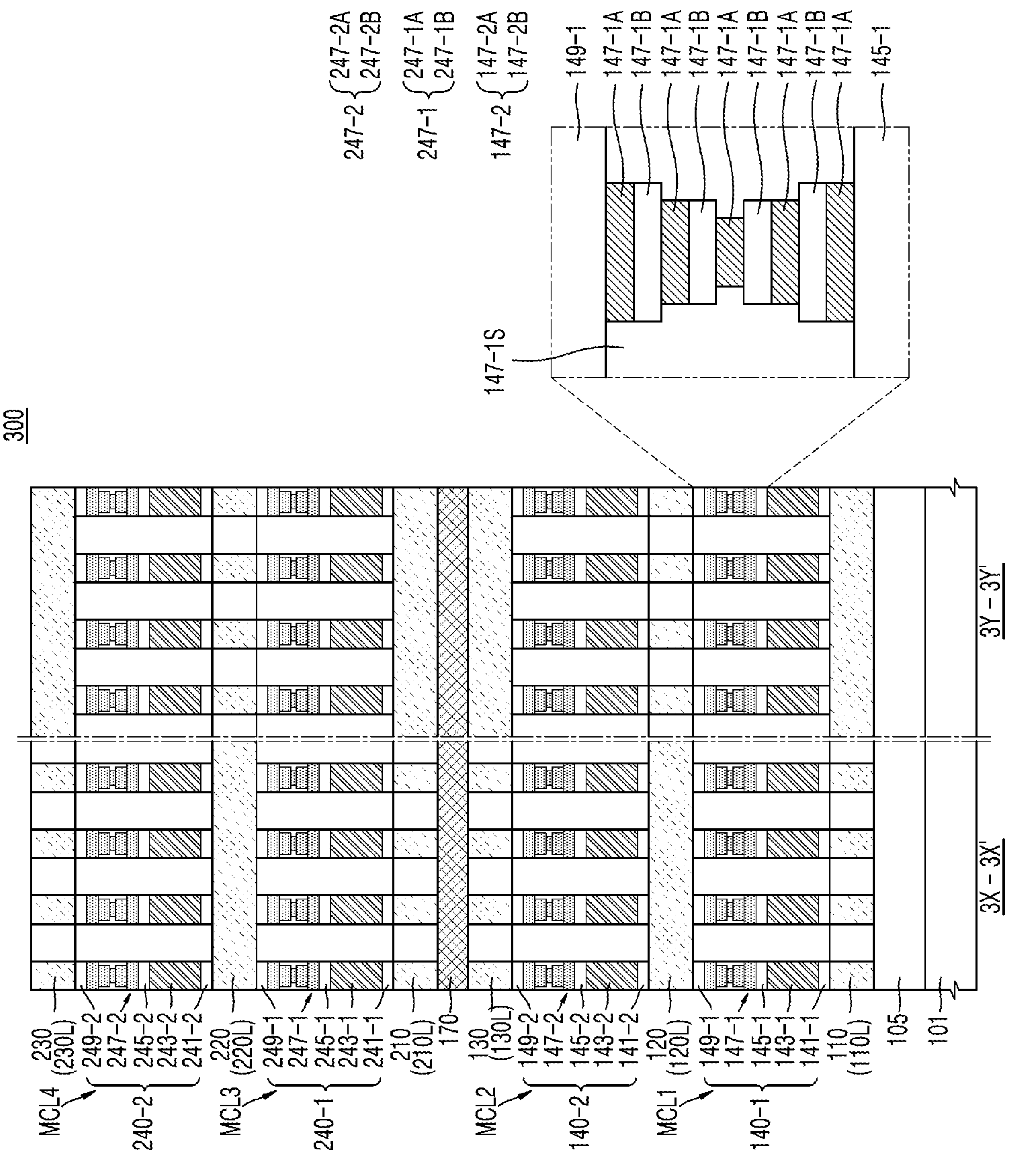
FIG. 8 is a cross-sectional view taken along lines 3X-3X' and 3Y-3Y' of FIG. 7.

FIG. 7 is a perspective view illustrating a variable resistance memory device 300 according to an embodiment, and FIG. 8 is a cross-sectional view taken along lines 3X-3X' and 3Y-3Y' of FIG. 7.

Most components of the variable resistance memory device 300 and materials of the components, which are described hereinafter, are substantially the same as or similar to most components of the variable resistance memory devices 100 and 200 and materials of the components thereof, which are described with reference to FIGS. 1 to 6. Therefore, for convenience sake, a difference between the variable resistance memory devices 100 and 200 described above and the variable resistance memory device 300 will be mainly described.

Referring to FIGS. 7 and 8, the variable resistance memory device 300 according to the current embodiment may have a four-layer structure including four stacked memory cell layers MCL1, MCL2, MCL3, and MCL4.

In detail, the first memory cell layer MCL1 may be arranged between the first conductive line layer 110L and the second conductive line layer 120L, and the second memory cell layer MCL2 may be arranged between the second conductive line layer 120L and the third conductive line layer 130L. A second interlayer insulating layer 170 may be formed on the third conductive line layer 130L and a first upper conductive line layer 210L, a second upper conductive line layer 220L, and a third upper conductive line layer 230L may be arranged on the second interlayer insulating layer 170. The first upper conductive line layer 210L may include a plurality of first upper conductive lines 210 each having the same structure as that of each of the plurality of first conductive lines 110, the second upper conductive line layer 220L may include a plurality of second upper conductive lines 220 each having the same structure as that of each of the plurality of second conductive lines 120, and the third upper conductive line layer 230L may include a plurality of third upper conductive lines 230 each having the same structure as that of each of the plurality of third conductive lines 130 or each of the plurality of first conductive lines 110. The first upper memory cell layer MCL3 may be arranged between the first upper conductive line layer 210L and the second upper conductive line layer 220L, and the second upper memory cell layer MCL4 may be arranged between the second upper conductive line layer 220L and the third upper conductive line layer 230L.

The first to third conductive line layers 110L to 130L and the first and second memory cell layers MCL1 and MCL2 are the same as described above with reference to FIGS. 1 to 6. In addition, the first to third upper conductive line layers 210L to 230L and the first and second upper memory cell layers MCL3 and MCL4 may be substantially the same as the first to third conductive line layers 110L to 130L and the first and second memory cell layers MCL1 and MCL2, with the exception that the first to third upper conductive line layers 210L to 230L and the first and second upper memory cell layers MCL3 and MCL4 are arranged on the second interlayer insulating layer 170 instead of the first interlayer insulating layer 105.

In the variable resistance memory device 300 according to the current embodiment, in a stacked structure of phase change material layers 147-1A, 147-2A, 247-1A, and 247-2A having different areas, e.g., different area sizes, by a self-heating method of a confined heterostructure, due to a difference in voltage V in accordance with capacitance C, a phase change section gradually increases from the center of the stacked structure. In the variable resistance memory device 300, the phase change section varies in accordance with the voltage distribution so that a multi-level cell may be implemented. In addition, in the variable resistance memory device 300, because a ratio of the voltage V applied to each of the phase change material layers 147-1A, 147-2A, 247-1A, and 247-2A may be mathematically inferred, an operating voltage may be reduced.

The variable resistance memory device 300 according to the current embodiment may have a structure in which the variable resistance memory device 100 described with reference to FIGS. 2 and 3 is repeatedly stacked. However, the structure of the variable resistance memory device 300 according to the current embodiment is not limited thereto.

FIGS. 9 to 14 are cross-sectional views of stages in a manufacturing process of a variable resistance memory device according to an embodiment. FIGS. 10 to 13 are enlarged views of part CC of FIG. 9.

Figure 9:
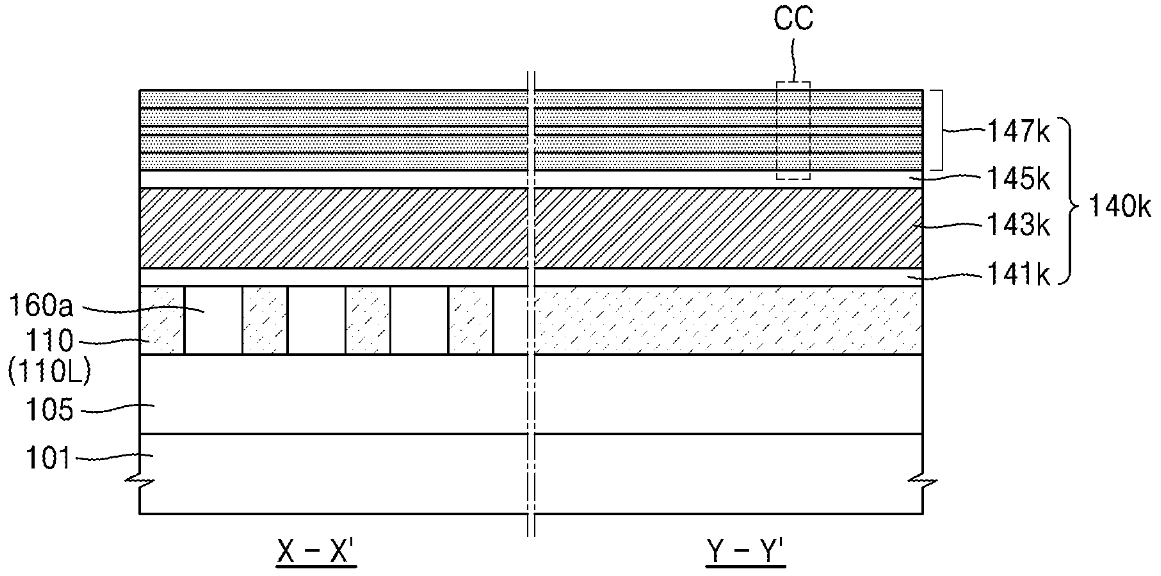
FIGS. 9 to 14 are cross-sectional views illustrating stages in a manufacturing process of a variable resistance memory device according to an embodiment.

Referring to FIG. 9, the interlayer insulating layer 105 is formed on the substrate 101. The interlayer insulating layer 105 may include, e.g., silicon oxide or silicon nitride. The first conductive line layer 110L including the plurality of first conductive lines 110 extending in the first horizontal direction (the X direction) and spaced apart from one another is formed on the interlayer insulating layer 105. Each of the plurality of first conductive lines 110 may be formed by an embossed etching process or a damascene process. The first insulating layer 160*a* extending in the first horizontal direction (the X direction) may be arranged among the plurality of first conductive lines 110.

A stacked structure 140*k* may be formed by sequentially stacking a lower electrode material layer 141*k*, a selection element material layer 143*k*, an intermediate electrode material layer 145*k*, and a variable resistance material layer 147*k* on the first conductive line layer 110L and the first insulating layer 160*a*.

Figure 10:
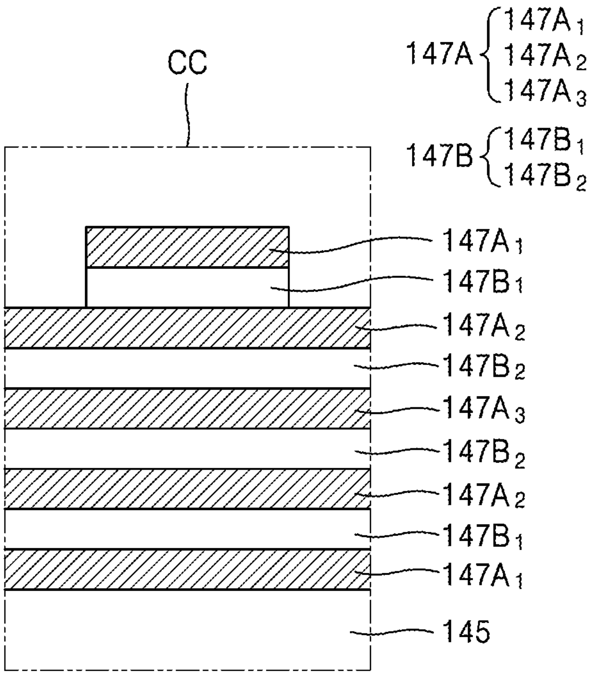

According to an embodiment, the variable resistance material layer 147*k* may be formed by alternately stacking the plurality of phase change material layers 147A (refer to FIG. 10) and the plurality of diffusion barrier layers 147B (refer to FIG. 10). In particular, the phase change material layers 147A may be respectively arranged as the uppermost layer and the lowermost layer of the variable resistance material layer 147*k*.

Referring to FIG. 10, after forming the stacked structure 140*k* (refer to FIG. 9), mask patterns spaced apart from one another in the first horizontal direction (the X direction) and the second horizontal direction (the Y direction) are formed on the stacked structure 140*k*. Parts of a phase change material layer 147$A_1$ and a diffusion barrier layer 147$B_1$ in the uppermost layer may be etched by using the mask patterns as etching masks. An anisotropic etching process using dry etching or an isotropic etching process using wet etching may be used as an etching process. After the etching process, the mask patterns may be removed by an ashing and strip process.

Figure 11:
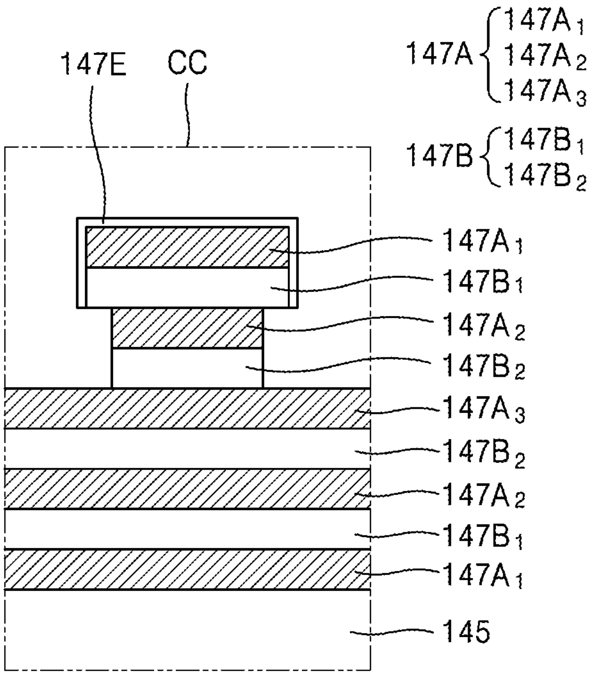

Referring to FIG. 11, an etching sacrificial layer 147E conformally covering the phase change material layer 147$A_1$ and the diffusion barrier layer 147$B_1$ in the uppermost layer, which are etched, may be formed.

Parts of a phase change material layer 147$A_2$ and a diffusion barrier layer 147$B_2$ under the uppermost layer may be etched by using the etching sacrificial layer 147E as an etching mask. An isotropic etching process using wet etching may be used as an etching process. The phase change material layer 147$A_2$ and the diffusion barrier layer 147$B_2$ under the uppermost layer, which are etched by the etching process, may respectively have widths less than those of the phase change material layer 147$A_1$ and the diffusion barrier layer 147$B_1$ in the uppermost layer, which are etched.

Figure 12:
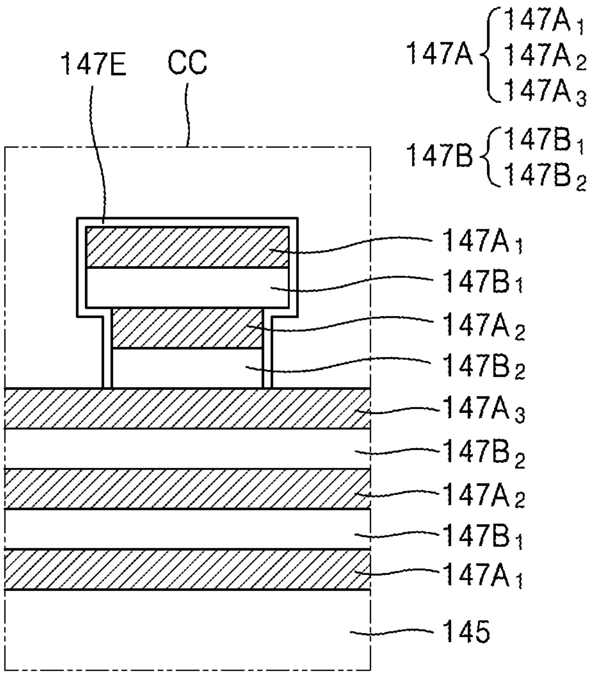

Referring to FIG. 12, the etching sacrificial layer 147E may be further formed to conformally cover the phase change material layer 147$A_2$ and the diffusion barrier layer 147$B_2$ under the uppermost layer, which are etched.

The etching sacrificial layer 147E may be formed to cover top and bottom surfaces and sides of the phase change material layer 147$A_1$ and the diffusion barrier layer 147$B_1$ in the uppermost layer, which are etched, and sides of the phase change material layer 147$A_2$ and the diffusion barrier layer 147$B_2$ under the uppermost layer, which are etched.

Figure 13:
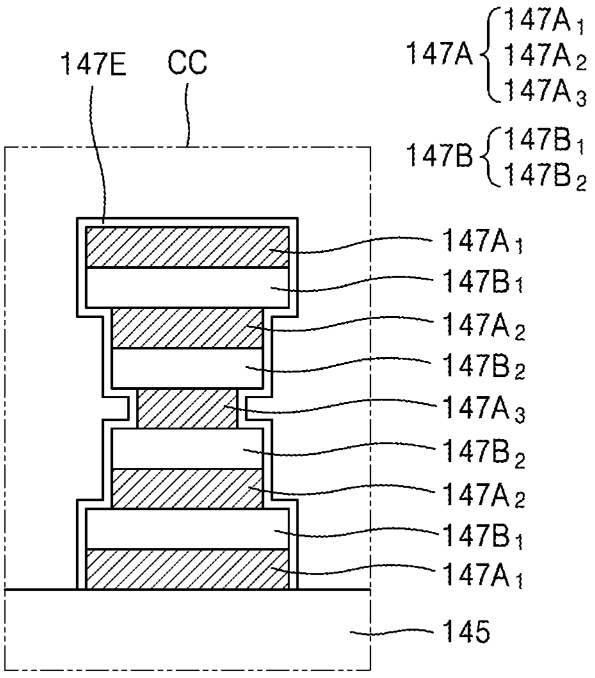

Referring to FIG. 13, by repeatedly performing the etching process and a process of forming the etching sacrificial layer 147E, the variable resistance material layer 147*k* may be formed in the form of stairs of which the center is concave, e.g., a shape of stairs with a concave center. For example, as illustrated in FIG. 13, the variable resistance material layer 147*k* may have a vertical cross-section having opposite sidewalls with an increasing-and-decreasing stair profile, such that a center along the vertical direction of the increasing-and-decreasing stair profile is concave, e.g., the phase change material layer 147$A_3$ may have the shortest horizontal width in the variable resistance material layer 147*k* and may be positioned in the center of the variable resistance material layer 147*k* along the vertical direction. For example, as illustrated in FIG. 13, the variable resistance material layer 147*k* may have an hourglass shape with stepped sidewalls (i.e., a stair profile) and the phase change material layer 147$A_3$ in the center of the hourglass shape. For example, as illustrated in FIG. 13, the opposite sidewalls of the variable resistance material layer 147*k* may be symmetrical to each other with respect to a vertical central axis through the variable resistance material layer 147*k*.

The etching sacrificial layer 147E formed to conformally cover outlines of the plurality of phase change material layers 147A and the plurality of diffusion barrier layers 147B may be completely removed after the etching process of the variable resistance material layer 147*k* is performed.

Figure 14:
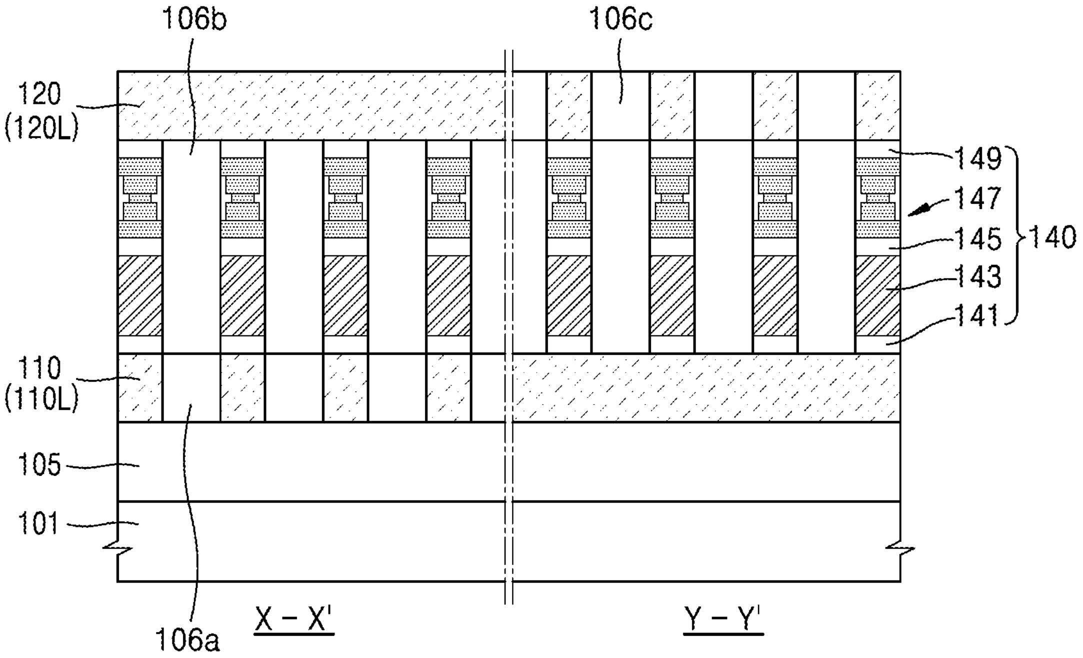

Referring to FIG. 14, after performing the etching process of the variable resistance material layer 147*k*, mask patterns spaced apart from one another in the first horizontal direction (the X direction) and the second horizontal direction (the Y direction) may be formed on the stacked structure 140*k*. The plurality of memory cells 140 may be formed by etching the stacked structure 140*k* so that parts of top surfaces of the first insulating layer 160*a* and the plurality of first conductive lines 110 are exposed by using the mask patterns.

Next, the second insulating layer 160*b* filling spaces among the plurality of memory cells 140 is formed. The second insulating layer 160*b* may include the same silicon oxide or silicon nitride as the first insulating layer 160*a*, or a different silicon oxide or silicon nitride than the silicon oxide or silicon nitride. The second insulating layer 160*b* may be formed by forming an insulating material layer to a thickness sufficient to completely fill the spaces among the plurality of memory cells 140 and planarizing the insulating material layer by a chemical mechanical polishing (CMP) process so that a top surface of the upper electrode layer 149 is exposed.

Next, by forming a conductive layer for the second conductive line layer and patterning the conductive layer by etching, the plurality of second conductive lines 120 may be formed. The plurality of second conductive lines 120 may extend in the second horizontal direction (the Y direction) and may be spaced apart from one another. The third insulating layer 160*c* extending in the second horizontal direction (the Y direction) may be arranged among the plurality of second conductive lines 120.

The variable resistance memory device 100 according to embodiments, which is manufactured by the above process, may include the variable resistance layer 147 including the plurality of phase change material layers 147A having different areas, e.g., adjacent ones of the plurality of phase change material layers 147A may have different area sizes from each other. In addition, in the variable resistance memory device 100 according to embodiments, which is manufactured by the above process, because a ratio of a voltage V applied to each of the plurality of phase change material layers 147A may be mathematically inferred, an operating voltage may be reduced.

Figure 15:
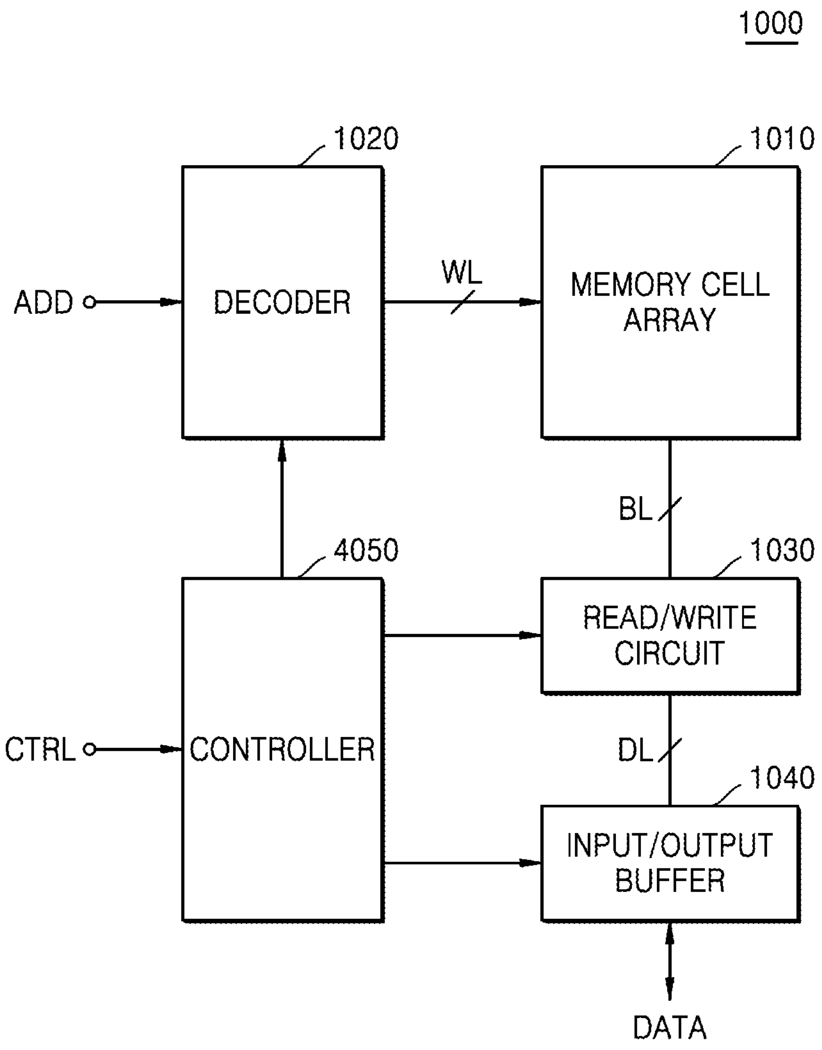
FIG. 15 is a block diagram illustrating a memory system including a variable resistance memory device according to an embodiment.

FIG. 15 is a block diagram illustrating a memory system 1000 including a variable resistance memory device according to an embodiment.

Referring to FIG. 15, the memory system 1000 may include a memory cell array 1010, a decoder 1020, a read/write circuit 1030, an input/output buffer 1040, and a controller 1050. The memory cell array 1010 may include at least one variable resistance memory device among the variable resistance memory devices 100, 200, and 300 described above with reference to FIGS. 1 to 8.

A plurality of memory cells in the memory cell array 1010 may be connected to the decoder 1020 through the word lines WL and may be connected to the read/write circuit 1030 through the bit lines BL. The decoder 1020 may receive an external address ADD and may decode a row address and a column address desired to be accessed in the memory cell array 1010 by control of the controller 1050 operating in accordance with a control signal CTRL.

The read/write circuit 1030 may receive data DATA from the input/output buffer 1040 and a data line DL and may store the data DATA in a selected memory cell of the memory cell array 1010 by control of the controller 1050 or may provide data read from a selected memory cell of the memory cell array 1010 to the input/output buffer 1040 by control of the controller 1050.

By way of summation and review, embodiments relate to a variable resistance memory device capable of implementing a multi-level cell (MLC) by using voltage distribution in a plurality of phase change material layers having different areas.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:

a substrate;

a first conductive line extending in a first horizontal direction on the substrate;

a second conductive line extending on the first conductive line in a second horizontal direction perpendicular to the first horizontal direction; and a memory cell at an intersection between the first conductive line and the second conductive line, the memory cell having a selection element layer, an intermediate electrode layer, and a variable resistance layer, wherein the variable resistance layer has a stepped profile and comprises a plurality of phase change material layers and a plurality of diffusion barrier layers stacked alternately in a vertical direction, wherein the width of each of the phase change material layers in the first horizontal direction is dependent on a location of the respective phase change material layer in the stack and a width of each of the diffusion barrier layers in the first horizontal direction is dependent on a position of the respective diffusion barrier layer in the vertical direction to form the stepped profile of the variable resistance layer, wherein the stepped profile has a minimum width in the first horizontal direction at a center of the stack in the vertical direction and a maximum width in the first horizontal direction at opposing ends of the stack in the vertical direction, wherein each phase change material layer is formed of an identical material, wherein adjacent phase change material layers formed of the identical material are separated by a respective diffusion barrier layer, wherein the phase change material layers include a first phase change material layer in contact with the intermediate electrode layer and a second phase change material layer at an uppermost end of the variable resistance layer, and wherein the phase change material layer at the center of the stack in the vertical direction has a width in the first horizontal direction that is less than the minimum width in the horizontal direction of the diffusion barrier layers.

2. The variable resistance memory device as claimed in claim 1, wherein:

the memory cell includes an upper electrode layer on an upper surface of the variable resistance layer; and the second phase change material layer is in contact with the upper electrode layer.

3. The variable resistance memory device as claimed in claim 2, wherein, as seen from a side view, widths of the phase change material layers and of the diffusion barrier layers decrease toward a center of the stack.

4. The variable resistance memory device as claimed in claim 2, further comprising an upper electrode layer on the variable resistance layer, wherein a voltage applied from the upper electrode layer and the intermediate electrode layer to the variable resistance layer is respectively distributed to the phase change material layers as different voltages in accordance with the capacitance of the phase change material layers.

5. The variable resistance memory device as claimed in claim 4, wherein a first voltage distributed to the first and second phase change material layers is greater than a second voltage distributed to other ones of the phase change material layers.

6. The variable resistance memory device as claimed in claim 5, wherein, in accordance with a difference between the first voltage and the second voltage, the memory cell is a multi-level cell.

7. The variable resistance memory device as claimed in claim 2, wherein the phase change material layers include at least one of $Sb_2Te_3$ and $Bi_2Te_3$, and the diffusion barrier layers include at least one of $TiTe_2$, $NiTe_2$, $MoTe_2$, and $ZrTe_2$.

8. The variable resistance memory device as claimed in claim 1, further comprising a spacer surrounding sidewalls of the variable resistance layer, the spacer having an internal sidewall having a shape complementary with respect to the shape of stairs of the variable resistance layer.

9. The variable resistance memory device as claimed in claim 8, wherein the variable resistance layer has a confined heterostructure.

10. The variable resistance memory device as claimed in claim 1, wherein the selection element layer includes an ovonic threshold switching (OTS) material.

11. A variable resistance memory device, comprising:

a substrate;

a first conductive line extending in a first horizontal direction on the substrate;

a second conductive line extending on the first conductive line in a second horizontal direction perpendicular to the first horizontal direction; and a memory cell at an intersection between the first conductive line and the second conductive line, the memory cell including a variable resistance layer having a stepped side profile formed by a stack of phase change material layers and diffusion barrier layers alternately stacked in a vertical direction, wherein the area of the phase change material layers in a horizontal plane decreases toward a center of the variable resistance layer in the vertical direction and areas of the diffusion barrier layers in a horizontal plane decrease toward the center of the variable resistance layer in the vertical direction, wherein the phase change material layer at the center of the variable resistance layer in the vertical direction has a width in the first horizontal direction that is less than the minimum width in the horizontal direction of the diffusion barrier layers, wherein each phase change material layer is formed of an identical material, and wherein the phase change material layers include a first phase change material layer at a lowermost end of the variable resistance layer and a second phase change material layer at an uppermost end of the variable resistance layer.

12. The variable resistance memory device as claimed in claim 11, further comprising:

a first electrode layer on the variable resistance layer; and a second electrode layer under the variable resistance layer, the variable resistance layer being between the first electrode layer and the second electrode layer, and the first electrode layer contacting a first phase change material layer of the stack of phase change material layers and the second electrode layer contacting a second phase change material layer of the stack of phase change material layers, wherein the second phase change material layer is in contact with the first electrode layer and the first phase change material layer is in contact with the second electrode layer.

13. The variable resistance memory device as claimed in claim 12, wherein:

in accordance with a difference among the areas of the phase change material layers, a phase change occurs at a first voltage applied to the first electrode layer and the second electrode layer for the first phase change material layer and the second phase change material layer and at a second voltage for a third phase change material layer located at the center of the variable resistance layer, the second voltage is less than the first voltage, and the memory cell is a multi-level cell.

14. The variable resistance memory device as claimed in claim 11, wherein each of the diffusion barrier layers has an area equal to an area of an adjacent one of the phase change material layers.

15. The variable resistance memory device as claimed in claim 11, wherein the variable resistance layer has a cross-sectional shape of an hourglass having sidewalls with a stair profile.

16. A variable resistance memory device, comprising:
a substrate;
first conductive lines extending on the substrate in a first horizontal direction;
second conductive lines extending on the first conductive lines in a second horizontal direction perpendicular to the first horizontal direction;
third conductive lines extending on the second conductive lines in the first horizontal direction;
first memory cells at intersections between the first conductive lines and the second conductive lines; and
second memory cells at intersections between the second conductive lines and the third conductive lines,
wherein each of the first memory cells and the second memory cells includes a selection element layer, an intermediate electrode layer, a variable resistance layer, and an upper electrode layer that are stacked in the stated order in a vertical direction,
wherein the variable resistance layer of each of the first and second memory cells includes a stack of phase change material layers formed of an identical material and diffusion barrier layers alternately stacked in the vertical direction to have a stepped side profile defined by side surfaces of the phase change material layers and diffusion barrier layers with a minimum width in the first horizontal direction occurring at a center phase change material layer in the vertical direction,
wherein the phase change material layer at the center of the stack in the vertical direction has a width in the first horizontal direction that is less than the minimum width in the horizontal direction of the diffusion barrier layers, and
wherein the phase change material layers include a first phase change material layer in contact with the intermediate electrode layer and a second phase change material layer in contact with the upper electrode layer.

17. The variable resistance memory device as claimed in claim 16, wherein the phase change material layers include at least one of $Sb_2Te_3$ and $Bi_2Te_3$, and the diffusion barrier layers include at least one of $TiTe_2$, $NiTe_2$, $MoTe_2$, and $ZrTe_2$.

18. The variable resistance memory device as claimed in claim 16, wherein a first voltage distributed to an uppermost and a lowermost of the phase change material layers is greater than a second voltage distributed to remaining ones of the phase change material layers.

19. The variable resistance memory device as claimed in claim 18, wherein:
a phase change occurs in at least some of the phase change material layers in accordance with a difference between the first and second voltages, and
the first memory cells and the second memory cells are multi-level cells.

20. The variable resistance memory device as claimed in claim 16, wherein the selection element layer includes an ovonic threshold switching (OTS) material.

* * * * *